(12) United States Patent
Ishizaka

(10) Patent No.: US 7,592,257 B2
(45) Date of Patent: Sep. 22, 2009

(54) SEMICONDUCTOR CONTACT STRUCTURE CONTAINING AN OXIDATION-RESISTANT DIFFUSION BARRIER AND METHOD OF FORMING

(75) Inventor: Tadahiro Ishizaka, Watervliet, NY (US)

(73) Assignee: Tokyo Electron Limited, Tokyo (JP)

( * ) Notice: Subject to any disclaimer, the term of this patent is extended or adjusted under 35 U.S.C. 154(b) by 155 days.

(21) Appl. No.: 11/748,308

(22) Filed: May 14, 2007

(65) Prior Publication Data
US 2008/0284020 A1 Nov. 20, 2008

(51) Int. Cl.
*H01L 21/44* (2006.01)
(52) U.S. Cl. .................. 438/685; 438/628; 438/659; 257/E21.478; 257/E21.584
(58) Field of Classification Search .............. 438/685, 438/686, 628, 659, 676, 798; 257/E21.17, 257/E21.019, E21.478, E21.584, E21.591, 257/E21.477
See application file for complete search history.

(56) References Cited

U.S. PATENT DOCUMENTS

| 6,184,130 | B1 | 2/2001 | Ku |
| 7,105,060 | B2 | 9/2006 | Shimogaki |
| 2005/0081882 | A1* | 4/2005 | Greer et al. ................. 134/1.1 |
| 2007/0059929 | A1* | 3/2007 | Cho et al. ................... 438/681 |
| 2008/0124484 | A1* | 5/2008 | Shinriki et al. ............. 427/535 |

* cited by examiner

*Primary Examiner*—Caridad M Everhart

(57) ABSTRACT

The method includes providing a patterned structure in a process chamber, where the patterned structure contains a micro-feature formed in a dielectric material and a contact layer at the bottom of the micro-feature, and depositing a metal carbonitride or metal carbide film on the patterned structure, including in the micro-feature and on the contact layer. The method further includes forming an oxidation-resistant diffusion barrier by increasing the nitrogen-content of the deposited metal carbonitride or metal carbide film, depositing a Ru film on the oxidation-resistant diffusion barrier, and forming bulk Cu metal in the micro-feature. A semiconductor contact structure is described.

18 Claims, 9 Drawing Sheets

SEMICONDUCTOR CONTACT STRUCTURE CONTAINING AN OXIDATION-RESISTANT DIFFUSION BARRIER AND METHOD OF FORMING

CROSS-REFERENCE TO RELATED APPLICATIONS

This application is related to co-pending U.S. patent application Ser. No. 11/378,271, entitled "METHOD OF PLASMA ENHANCED ATOMIC LAYER DEPOSITION OF TaC AND TaCN FILMS HAVING GOOD ADHESION TO COPPER," filed on Mar. 20, 2006, the entire content of which is hereby incorporated by reference.

FIELD OF INVENTION

The field of the invention relates generally to the field of integrated circuit manufacturing and, more specifically to formation of semiconductor contact structures containing an oxidation-resistant diffusion barrier for copper metallization.

BACKGROUND OF THE INVENTION

An integrated circuit contains various semiconductor devices and a plurality of conducting metal paths that provide electrical power to the semiconductor devices and allow these semiconductor devices to share and exchange information. Within an integrated circuit, metal layers are stacked on top of one another using intermetal or interlayer dielectric layers that insulate the metal layers from each other. Metal layers typically occupy etched pathways in the interlayer dielectric. Normally, each metal layer must form an electrical contact to at least one additional metal layer or conductive layer. Such electrical contact is achieved by etching a hole in the interlayer dielectric that separates the metal layers or a metal layer and a doped substrate region, and filling the resulting via with a metal (plug) to create a vertical interconnect structure. A "via" normally refers to any micro-feature such as a hole, line or other similar feature formed within a dielectric layer that provides an electrical connection through the dielectric layer to a conductive layer underlying the dielectric layer. Similarly, micro-features containing metal layers connecting two or more vias are normally referred to as trenches.

Tungsten (W) plug metallization is widely used for vertical interconnect structures of various metal layers in integrated circuit fabrication. The scaling of interconnect structures, including contact size, results in an increase in contact resistivity. Replacing the conventional W plug with a lower contact resistivity metal such as copper (Cu) provides significant gains in switching delay (RC-delay) and power consumption. Furthermore, Cu plugs alleviate the rapid rise in resistance as W contacts scale below about 70 nm ($nm=10^{-9}$ m) in diameter. Metal plugs are surrounded by barrier films that separate the metal plugs from dielectric materials and other materials in the semiconductor device. Cu cannot be put in direct contact with dielectric materials since Cu has poor adhesion to the dielectric materials and Cu is known to easily diffuse into common integrated circuit materials such as silicon and dielectric materials where Cu is a mid-bandgap impurity. Furthermore, oxygen can diffuse from an oxygen-containing dielectric material into Cu, thereby decreasing the electrical conductivity of the Cu metal. Therefore, a diffusion barrier material is formed on dielectric materials and other materials in the integrated circuits to surround the Cu and prevent diffusion of the Cu into the integrated circuit materials. The diffusion barrier material for Cu metallization usually includes a Ta-containing material, for example a TaN/Ta bilayer.

One area of concern when using Cu and W plugs is the contact resistivity at the bottom of a via. The presence of contaminants such as oxygen in the Ta-containing material can result in high contact resistivity and in weak adhesion between Ta-containing material and other materials at the bottom of the via. Thus, new processing methods are needed for improving contact resistivity and film properties for contact structures containing Cu.

BRIEF DESCRIPTION OF THE DRAWINGS

The present invention is illustrated by way of example and not as a limitation in the figures of the accompanying drawings.

DETAILED DESCRIPTION OF SEVERAL EMBODIMENTS

Figure 1A:
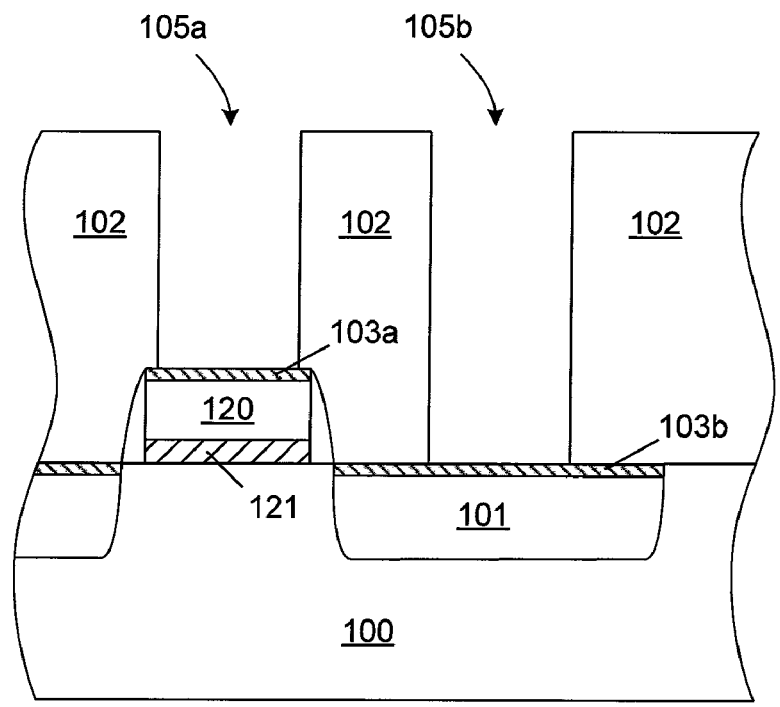
FIGS. 1A-1E schematically show a method for forming a semiconductor contact structure according to an embodiment of the invention.

Formation of a semiconductor contact structure containing Cu is disclosed in various embodiments. The semiconductor contact structure includes a micro-feature formed in a dielectric material and a contact layer at the bottom of the micro-feature. The micro-feature is filled with bulk Cu metal and further contains a Ru film and an oxidation-resistant diffusion barrier surrounding the bulk Cu metal in the micro-feature. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

There is a general need for replacing the conventional W plug with lower contact resistivity Cu metal to achieve significant gains in switching delay (RC-delay) and power dissipation. The use of Cu metal at the contact level requires surrounding the Cu metal with a diffusion barrier material to provide good adhesion to dielectric materials and other materials in the semiconductor device. Low levels of oxygen contaminants in the diffusion barrier are desired in order to provide low contact resistivity and good adhesion between the diffusion barrier and other materials at the contact level. In one embodiment, Cu metallization containing a traditional TaN diffusion barrier and a Ta film on the TaN diffusion barrier can be replaced by an oxidation-resistant TaCN diffusion barrier and a Ru film on the oxidation-resistant TaCN diffusion barrier. The Ru film can be deposited with superior conformality over high-aspect ratio micro-features compared to the Ta film and the Ru film improves a subsequent Cu plating process that is utilized to fill micro-feature with bulk Cu metal.

In the following description, in order to facilitate a thorough understanding of the invention and for purposes of explanation and not limitation, specific details are set forth, such as a particular geometry of the semiconductor contact structure. However, it should be understood that the invention may be practiced in other embodiments that depart from these specific details.

Figure 1B:
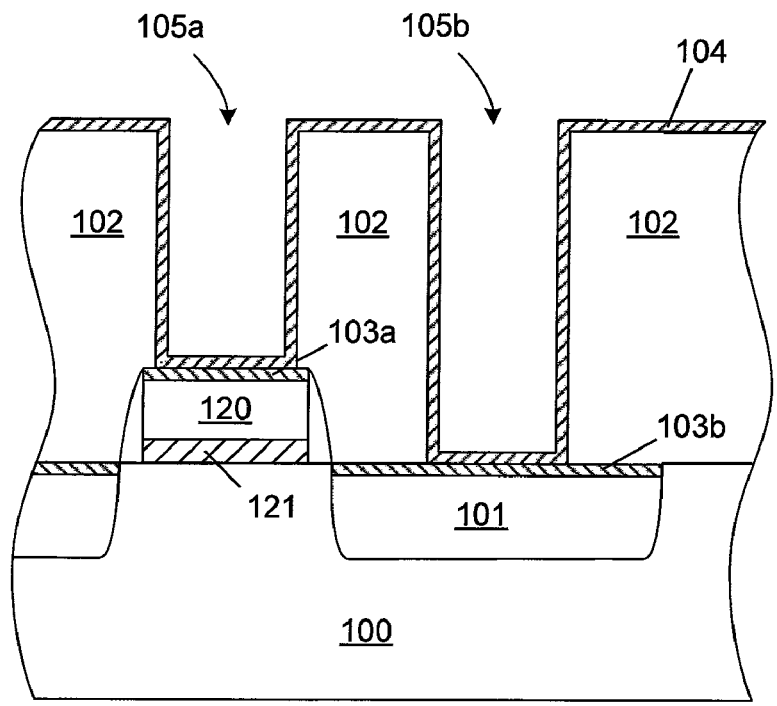
Figure 1C:
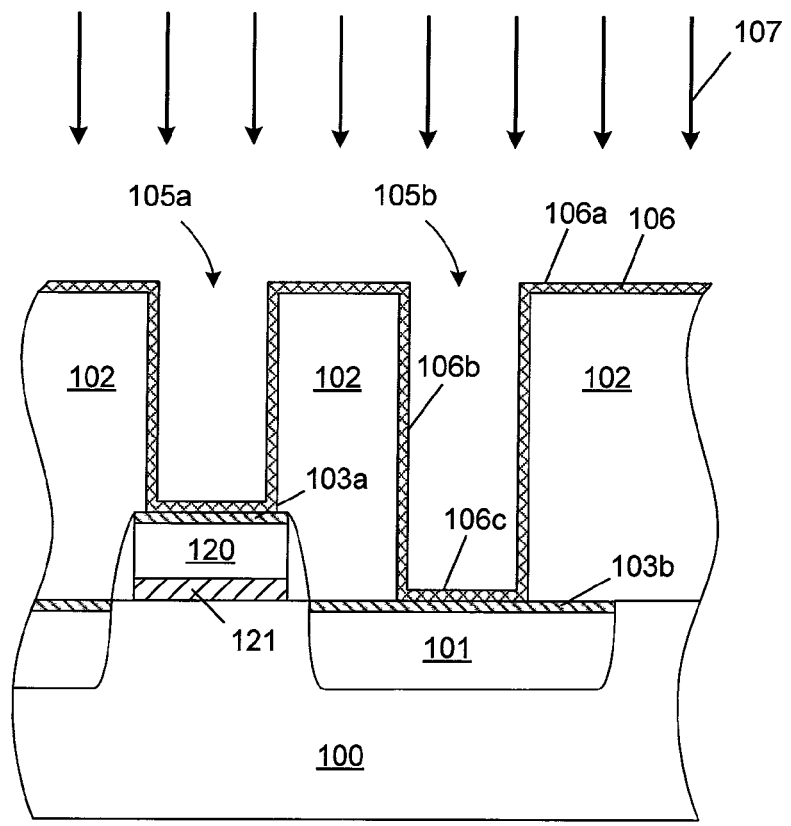
Figure 1D:
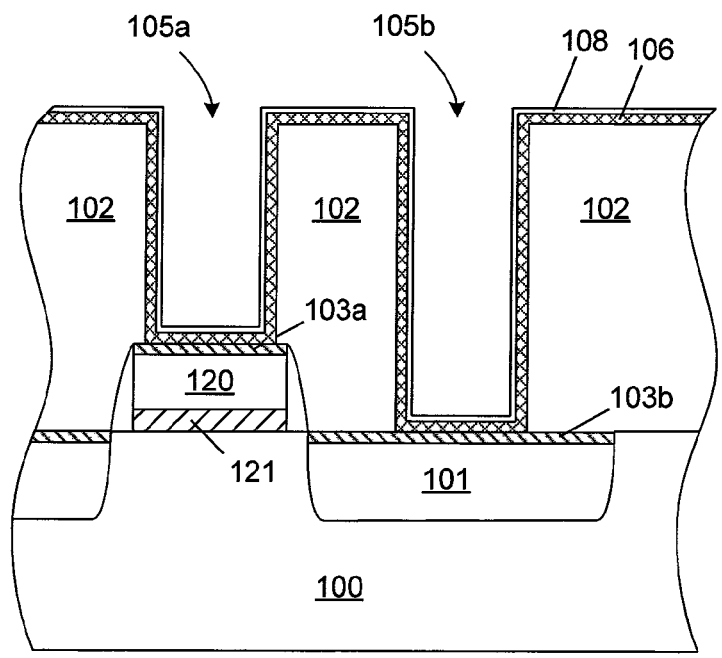
Figure 1E:
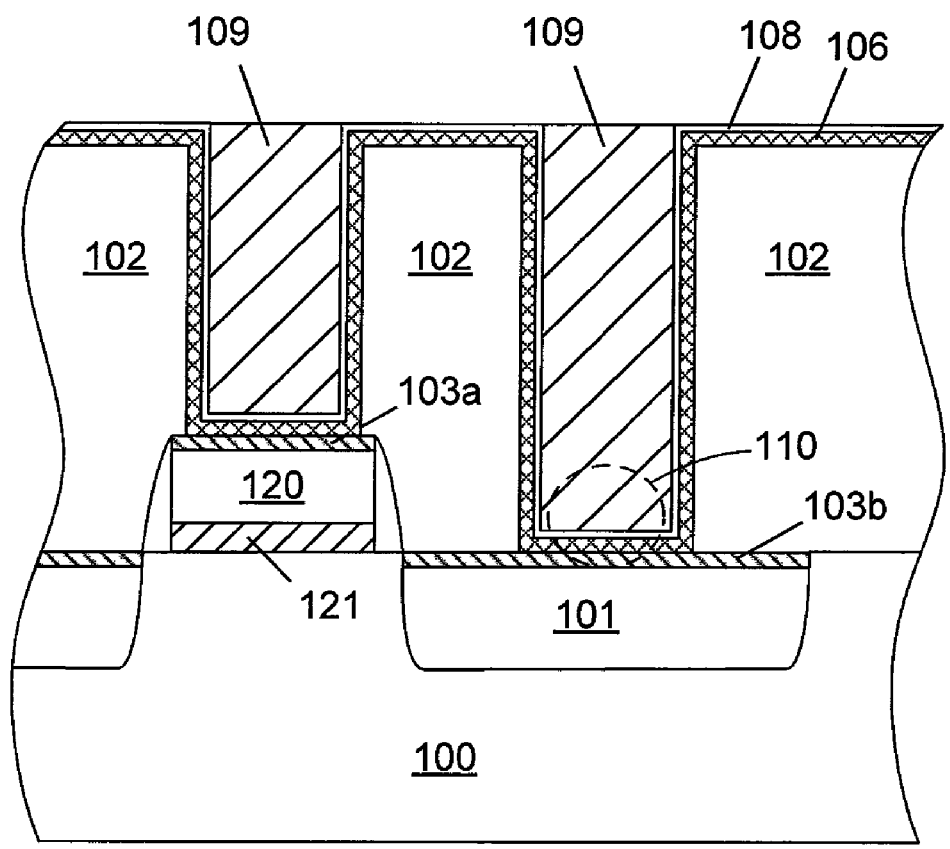
Figure 1F:
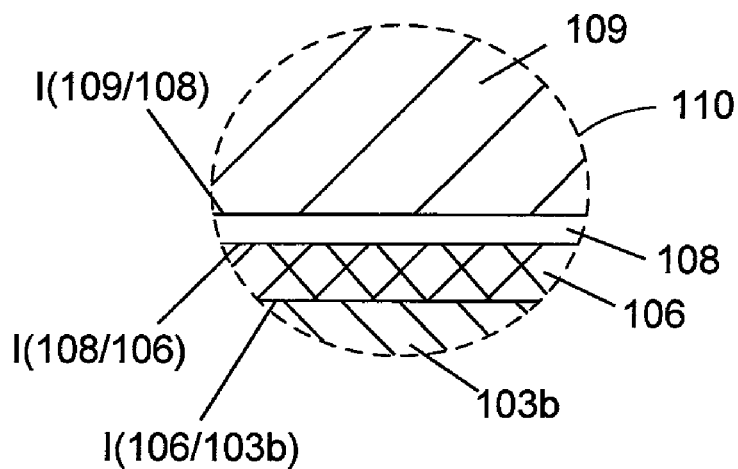
FIG. 1F schematically shows an expanded view of a contact region in FIG. 1E.

FIGS. 1A-1E schematically show a method for forming a semiconductor contact structure according to an embodiment of the invention and FIG. 1F schematically shows an expanded view of a contact region in FIG. 1E. FIG. 1A shows a cross-sectional view of a patterned structure containing a micro-feature 105a formed in a dielectric film 102 and a silicide contact layer 103a formed on a gate electrode 120 at the bottom of the micro-feature 105a. The gate electrode 120 is part of a gate structure that further contains a gate dielectric film 121. The gate dielectric film 121 can contain $SiO_2$, $SiO_xN_y$, $SiN_y$, or a high dielectric constant (high-k) material having a dielectric constant greater than that of $SiO_2$ (k~3.9). High-k materials can include metal oxides, metal oxynitrides, and their silicates, for example $Ta_2O_5$, $TiO_2$, $ZrO_2$, $Al_2O_3$, $Y_2O_3$, $HfO_xN_y$, $HfSiO_xN_y$, $HfSiO_x$, $HfO_2$, $ZrO_2$, $ZrSiO_x$, $ZrO_xN_y$, $ZrSiO_xN_y$, $TaSiO_x$, $SrO_x$, $SrSiO_x$, $LaO_x$, $LaSiO_x$, $YO_x$, $YSiO_x$, or BaO, or combinations of two or more thereof.

Furthermore, the patterned structure in FIG. 1A contains a micro-feature 105b formed in the dielectric film 102 and a silicide contact layer 103b formed on a doped substrate region 101 (e.g., a drain or a source region) in the substrate 100 at the bottom of the micro-feature 105b. The substrate 100 can, for example, be a 200 mm Si wafer, a 300 mm Si wafer, or an even larger Si wafer. The dielectric film 102 can contain $SiO_2$, SiON, SiN, or a low dielectric constant (low-k) material having a dielectric constant less than that of $SiO_2$ (k~3.9). Common low-k materials can contain simple or complex compounds of Si, O, N, C, H, and/or halogens, either as dense or porous materials. According to an embodiment of the invention, the micro-features 105a, 105b can be vias with aspect ratios (depth/width) greater than or equal to about 2, for example 3, 4, 5, 6, 7, 12, 15, or higher. The vias can have widths of about 200 nm or less, for example 150 nm, 100 nm, 65 nm, 45 nm. 32 nm, 20 nm, or lower. In one example, the micro-features 105a, 105b can be 45 nm wide vias with aspect ratios of about 7. However, embodiments of the invention are not limited to these aspect ratios or via widths, as other aspect ratios or via widths may be utilized. The silicide contact layers 103a and 103b provide thin stable electrical contacts and can, for example, contain $CoSi_2$, PtSi, $Pd_2Si$, $TiSi_2$, $WSi_2$, $NiSi_2$, or $TaSi_2$, or a combination of two or more thereof. One combination may contain PtNiSi that allows the use of higher processing temperatures than $NiSi_2$. Processing methods for forming the patterned structure depicted in FIG. 1A are well known to one skilled in the art.

In FIG. 1B, a metal carbonitride or metal carbide film 104 is formed on the dielectric film 102 and on the silicide contact layers 103a and 103b at the bottom of the micro-features 105a and 105b, respectively. The metal carbonitride or metal carbide film 104 can, for example, contain TaCN, TaC, TiCN, or TiC, or a combination thereof. A thickness of the metal carbonitride or metal carbide film 104 can, for example, be between about 1 nm and about 10 nm, or between about 2 nm and about 5 nm, for example about 4 nm. The metal carbonitride or metal carbide film 104 may be deposited by a variety of different deposition methods known by one of ordinary skill in the art, including, but not limited to, chemical vapor deposition (CVD), pulsed CVD, plasma-enhanced CVD (PECVD), atomic layer deposition (ALD), plasma-enhanced ALD (PEALD), or sputtering methods.

FIG. 1C schematically shows a method of modifying the metal carbonitride or metal carbide film 104 by exposure to a plasma-excited nitrogen-containing gas 107. Exposure of the metal carbonitride or metal carbide film 104 to the plasma-excited nitrogen-containing gas 107 incorporates nitrogen into at least a portion of a thickness of the metal carbonitride or metal carbide film 104 to form an oxidation-resistant diffusion barrier 106. As one skilled in the art will appreciate, directional plasma exposure can be used to control nitrogen content and nitrogen distribution in the external surface regions 106a (field area), 106b (micro-feature sidewall area), 106c (micro-feature bottom area) of the oxidation-resistant diffusion barrier 106 and depth profiles from the external surface regions 106a, 106b, 106c through a thickness of the oxidation-resistant diffusion barrier 106. Directional plasma exposure incorporates larger amount of nitrogen into external surface regions 106a and 106c than into the external surface region 106b on the sidewalls of the micro-feature 105a and 105b. The depth profile of the incorporated nitrogen in the oxidation-resistant diffusion barrier 106 can, for example, be adjusted by selecting the plasma processing conditions, plasma exposure times, and optionally annealing conditions following the plasma exposure.

A depth profile of the incorporated nitrogen can be substantially uniform throughout a thickness of the oxidation-resistant diffusion barrier 106, or alternately, the concentration of the incorporated nitrogen can be non-uniform throughout the thickness. For example, the concentration of the incorporated nitrogen can be highest at the external surface regions 106a, 106b, and 106c and exhibit gradual changes in nitrogen concentration throughout a thickness of the oxidation-resistant diffusion barrier 106. In another example, the nitrogen concentration can have a maximum inside the oxidation-resistant diffusion barrier 106. According to embodiments of the invention, the concentration of the incorporated nitrogen may be modulated, both in shape, including maximum nitrogen concentration and width of the maximum, and location of the maximum with respect to the external surface L regions 106a, 106b, and 106c. Non-uniform concentration of incorporated nitrogen in the oxidation-resistant diffusion barrier 106 can be utilized to reduce film strain that can result in cracking, peeling, and delamination problems of a manufactured semiconductor device.

FIG. 1D schematically shows a Ru film 108 deposited on the oxidation-resistant diffusion barrier 106. A thickness of the Ru film 108 can, for example, be between about 0.5 nm and about 5 nm, or between about 1 nm and about 3 nm, for example about 2 nm. In one example, the Ru film 108 may be conformally deposited by a thermal CVD process utilizing a $Ru_3CO_{12}$ precursor and a CO carrier gas as described in U.S. patent application Ser. No. 10/996,145, entitled "METHOD AND DEPOSITION SYSTEM FOR INCREASING DEPOSITION RATES OF METAL LAYERS FROM METAL-CARBONYL PRECURSORS," the entire content of which is herein incorporated by reference. In another example, the Ru film 108 may be deposited by a thermal CVD process utilizing a ruthenium metalorganic precursor. Exemplary ruthenium metalorganic precursors include (2,4-dimethylpentadienyl) (ethylcyclopentadienyl) ruthenium (Ru(DMPD)(EtCp)), bis(2,4-dimethylpentadienyl)ruthenium (Ru(DMPD)$_2$), 4-dimethylpentadienyl)(methylcyclopentadienyl)ruthenium (Ru(DMPD)(MeCp)), and bis(ethylcyclopentadienyl)ruthenium (Ru(EtCp)$_2$), as well as combinations of these and other precursors. Other examples for depositing the Ru film 108 include sputtering methods using a solid Ru metal target.

FIG. 1E schematically shows bulk Cu metal 109 filling the micro-features 105a and 105b. Bulk Cu metal deposition processes are well known by one of ordinary skill in the art of circuit fabrication and can, for example, include an electrochemical plating process or an electroless plating process. Commonly, bulk Cu metal deposition is followed by a chemical mechanical polishing (CMP) process to planarize and remove excess Cu metal. Other bulk Cu metal deposition processes are also available, for example Cu sputtering processes. Although not shown in FIGS. 1D-1E, a Cu seed layer may be deposited on the Ru film 108 to provide a Cu growth surface for the Cu plating process. A thickness of the Cu seed layer can, for example, be between about 0.5 nm and about 5 nm, or between about 1 nm and about 3 nm, for example about 2 nm. The Cu seed layer may be deposited by sputtering methods, for example by ionized physical vapor deposition (IPVD). An exemplary IPVD system is described in U.S. Pat. No. 6,287,435.

FIG. 1F schematically shows an expanded view of a contact region 110 in FIG. 1E. Contact resistivity ($R_c$) of the structure depicted in FIG. 1E includes the sum of the electrical resistivities of the bulk Cu metal 109, the Ru film 108, the oxidation-resistant diffusion barrier 106, interface I(109/108) between the bulk Cu metal 109 and the Ru film 108, interface I(108/106) between the Ru film 108 and the oxidation-resistant diffusion barrier 106, and interface I(106/103 between the oxidation-resistant diffusion barrier 106 and the silicide contact layer 103b.

In FIG. 1F, one area of concern regarding the contact resistivity is the electrical resistance at the interface I(108/106) between the Ru film 108 and the oxidation-resistant diffusion barrier 106. According to embodiments of the invention, formation of oxidation-resistant diffusion barrier 106 through control of the nitrogen content and nitrogen distribution in the oxidation-resistant diffusion barrier 106 reduces or prevents oxidation of the oxidation-resistant diffusion barrier 106 that can increase the electrical resistance of the oxidation-resistant diffusion barrier 106 and the interface I(108/106). For example, the oxidation can occur by exposure to oxygen-containing background gases (e.g., $O_2$ or $H_2O$) during substrate transfer or idle time following formation of the oxidation-resistant diffusion barrier 106 and by exposure to oxygen-containing process gases (e.g., $Ru_3(CO)_{12}$, CO) or oxygen-containing background gases during deposition of the Ru film 108. Furthermore, low contact resistivity can be achieved by utilizing a thin oxidation-resistant diffusion barrier 106, and forming an ohmic contact at the interface I(106/103b) between the oxidation-resistant diffusion barrier 106 and the silicide contact layer 103b.

Figure 2:
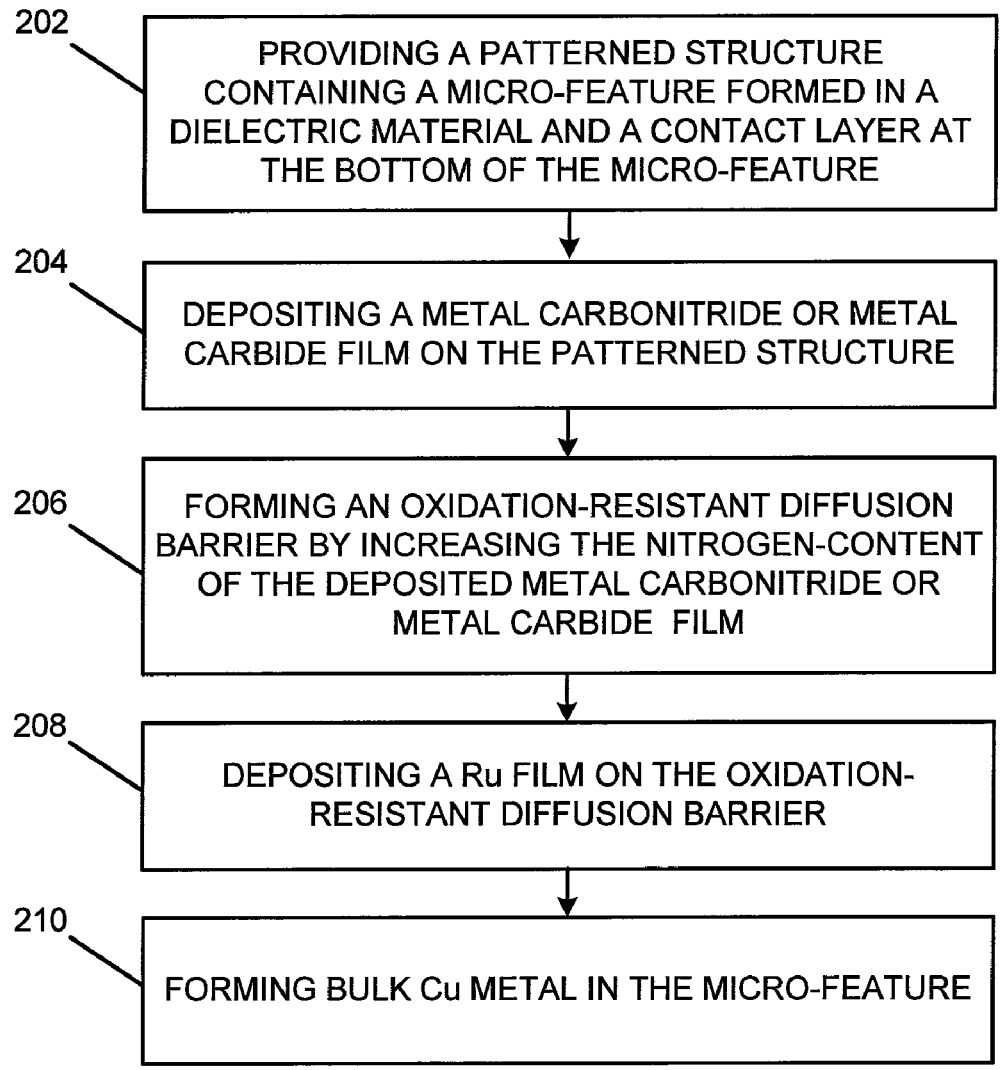
FIG. 2 is a flowchart describing a method for forming a semiconductor contact structure according to an embodiment of the invention.

FIG. 2 is a flowchart describing a method for forming a semiconductor contact structure according to an embodiment of the invention. In block 202, a patterned structure is provided in a process chamber, where the patterned structure contains a micro-feature formed in a dielectric material and a contact layer at the bottom of the micro-feature. In block 204, a metal carbonitride or metal carbide film is deposited on the patterned structure, including in the micro-feature and on the contact layer. In block 206, an oxidation-resistant diffusion barrier is formed by increasing the nitrogen-content of the metal carbonitride or metal carbide film. In block 208, a Ru film is deposited on the oxidation-resistant diffusion barrier. In block 210, bulk Cu metal is formed in the micro-feature, where the Ru film and the oxidation-resistant diffusion barrier surround the bulk Cu metal in the micro-feature.

Figure 3:
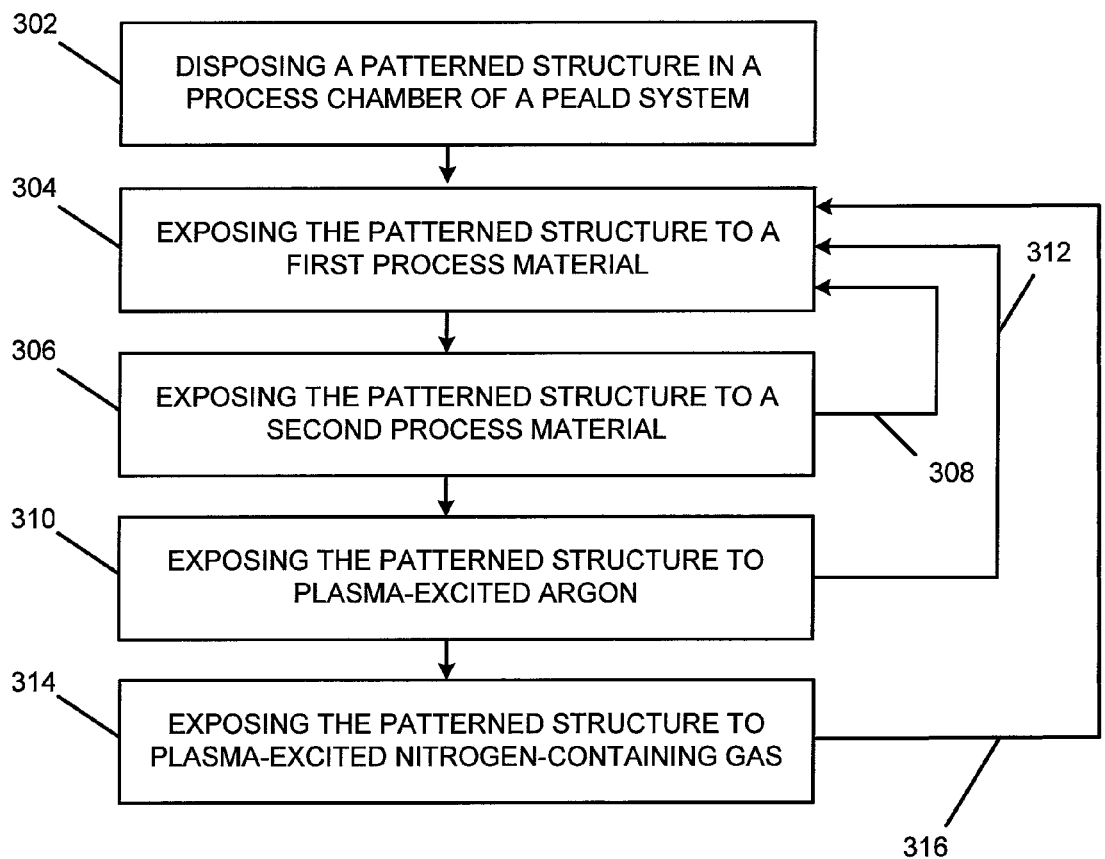
FIG. 3 is a flowchart describing a method for forming an oxidation-resistant diffusion barrier according to an embodiment of the invention.
Figure 4:
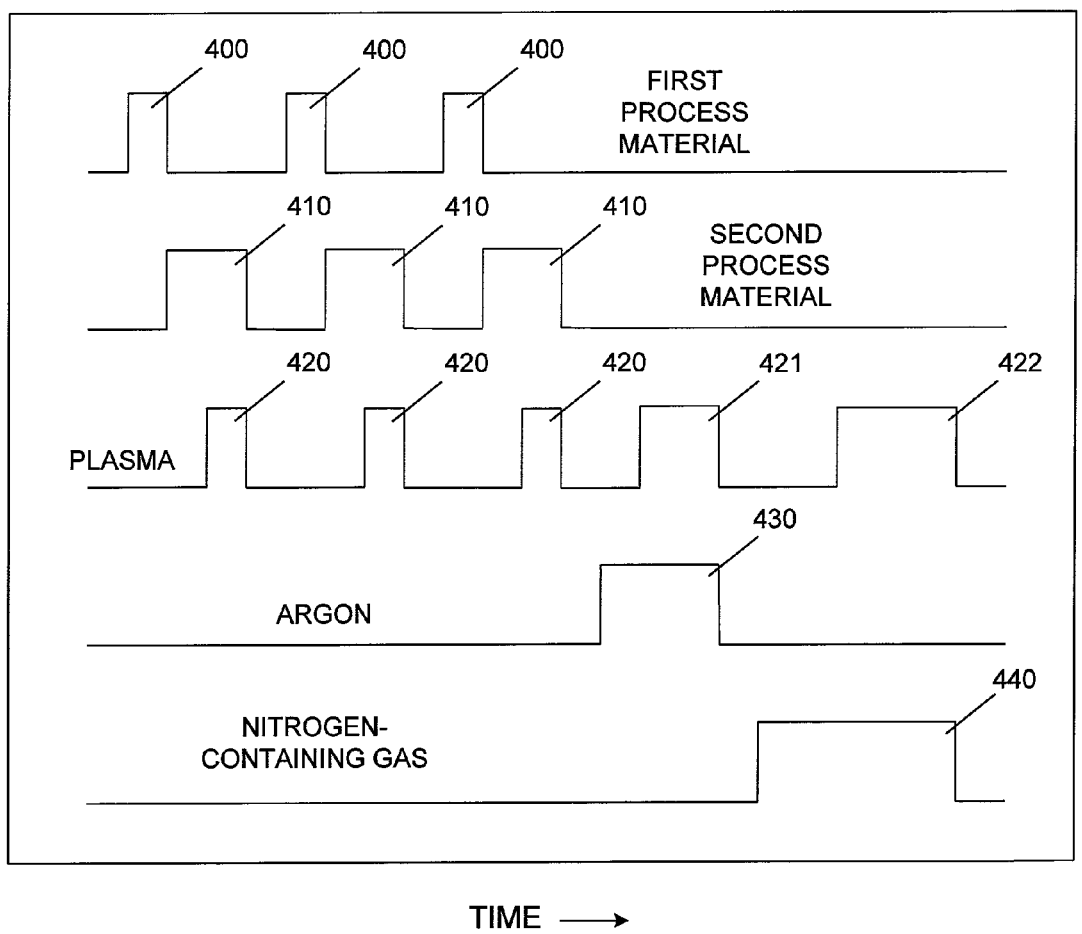
FIG. 4 is a timing diagram for forming an oxidation-resistant diffusion barrier according to an embodiment of the invention.

FIG. 3 is a flowchart describing one embodiment of a method for forming an oxidation-resistant diffusion barrier and FIG. 4 is a timing diagram describing one embodiment for forming the oxidation-resistant diffusion barrier. The processes described in FIGS. 3 and 4 can, for example, be at least partially performed by the processing system described in FIG. 7. In block 302, a patterned structure is disposed in a process chamber of a processing system. In one embodiment, the patterned structure may be that of FIG. 1A. Once in the process chamber, the substrate 100 is heated to a predetermined temperature suitable for deposition of a metal carbonitride or metal carbide film and the process chamber is maintained at subatmospheric pressure during processing.

In block 304, the patterned structure is exposed to a first process material containing a Ta- or Ti-containing precursor for a time period 400. The time period 400 can, for example, be between 0.5 sec and 10 sec long, and can be 1 sec long. The process chamber pressure can, for example, be between 0.05 Torr and 5 Torr, and can be 0.2 Torr. The first process material may be delivered "neat" (undiluted by a carrier gas) to the process chamber or a carrier gas may be used to dilute the first process material. The carrier gas can, for example, include argon (Ar), nitrogen ($N_2$), or hydrogen ($H_2$). A gas flow rate of the carrier gas can, for example, be between 10 sccm and about 500 sccm, and can be 50 sccm. If the substrate temperature is below the thermal decomposition temperature of the first process material, the first process material can be adsorbed on the substrate surface in a self-limiting manner, where the adsorption stops when the thickness of the adsorbed material corresponds to about one atomic layer or less. The thermal decomposition temperature of Ta- or Ti-containing precursors may be determined by experimentation or obtained from the literature. In one example, a Ta(NMe$_2$)$_3$ (NCMe$_2$Et) (TAIMATA) precursor and a substrate temperature of 180° C. may be used to adsorb TAIMATA on the substrate surface in a self-limiting manner.

A wide variety of Ta- and Ti-containing precursors may be utilized as the first process material. Examples of Ta-containing precursors containing "Ta—N" intra-molecular bonds include TAIMATA, Ta(NEt$_2$)$_5$ (PDEAT), Ta(NMe$_2$)$_5$ (PDMAT), Ta(NEtMe)$_5$ (PEMAT), (tBuN)Ta(NMe$_2$)$_3$ (TBTDMT), (tBuN)Ta(NEt$_2$)$_3$ (TBTDET), (tBuN)Ta(NEtMe)$_3$ (TBTEMT), and (iPrN)Ta(NEt$_2$)$_3$ (IPTDET). Examples of Ta-containing precursors containing "Ta—C" intra-molecular bonds, for example Ta($\eta^5$-C$_5$H$_5$)$_2$H$_3$, Ta(CH$_2$)(CH$_3$)($\eta^5$-C$_5$H$_5$)$_2$, Ta($\eta^3$-C$_3$H$_5$) ($\eta^5$-C$_5$H$_5$)$_2$, Ta(CH$_3$)$_3$($\eta^5$-C$_5$H$_5$)$_2$, Ta(CH$_3$)$_4$($\eta^5$-C$_5$(CH$_3$)$_5$), or Ta($\eta^5$-C$_5$(CH$_3$)$_5$)$_2$H$_3$. Examples of Ti-containing precursors having "Ti—N" intra-molecular bonds include Ti(NEt$_2$)$_4$ (TDEAT), Ti(NMeEt)$_4$ (TEMAT), Ti(NMe$_2$)$_4$ (TDMAT). Examples of Ti-containing precursors containing "Ti—C" intra-molecular bonds include Ti(COCH$_3$)($\eta^5$-C$_5$H$_5$)$_2$Cl, Ti($\eta^5$-C$_5$H$_5$)Cl$_2$, Ti($\eta^5$-C$_5$H$_5$)Cl$_3$, Ti($\eta^5$-C$_5$H$_5$)$_2$Cl$_2$, Ti($\eta^5$-C$_5$(CH$_3$)$_5$)Cl$_3$, Ti(CH$_3$)($\eta^5$-C$_5$H$_5$)$_2$Cl, Ti($\eta^5$-C$_9$H$_7$)$_2$Cl$_2$, Ti(($\eta^5$-C$_5$(CH$_3$)$_5$)$_2$Cl, Ti(($\eta^5$-C$_5$(CH$_3$)$_5$)$_2$Cl$_2$, Ti($\eta^5$-C$_5$H$_5$)$_2$($\mu$-Cl)$_2$, Ti($\eta^5$-C$_5$H$_5$)$_2$(CO)$_2$, Ti(CH$_3$)$_3$($\eta^5$-C$_5$H$_5$), Ti(CH$_3$)$_2$($\eta^5$-C$_5$H$_5$)$_2$, Ti(CH$_3$)$_4$, Ti($\eta^5$-C$_5$H$_5$)($\eta^7$-C$_7$H$_7$), Ti($\eta^5$-C$_5$H$_5$)($\eta^8$-C$_8$H$_8$) Ti(C$_5$H$_5$)$_2$($\eta^5$-C$_5$H$_5$)$_2$, Ti(($C_5$H$_5$)$_2$)($\eta$-H)$_2$, Ti($\eta^5$-C$_5$(CH$_3$)$_5$)$_2$, Ti($\eta^5$-C$_5$(CH$_3$)$_5$)$_2$(H)$_2$, and Ti(CH$_3$)$_2$($\eta^5$-C$_5$(CH$_3$)$_5$)$_2$.

In block 306, the patterned structure is exposed to a second process material for a time period 410 and a plasma is generated in the process chamber for a time period 420 during exposure of the second process material. As depicted in FIG. 4, the process chamber may be purged by the second process material to remove unreacted first process material and reaction byproducts from the process chamber and to stabilize the gas flow and process chamber pressure prior to the plasma generation. This ensures that a reaction in block 306 occurs primarily between the second process material and the adsorbed layer of the first process material on the substrate, rather than in the gaseous environment in the process chamber. The time period 410 can, for example, be between 1 sec and 100 sec long, and can be 11 sec long. The time period 420 can, for example, be between 1 sec and 100 sec long, and can be 10 sec long. The process chamber pressure can, for example, be between 0.1 Torr and 5 Torr, and can be 1 Torr. A gas flow rate of the second process material can, for example, be between 10 sccm and about 5000 sccm, and can be 2000 sccm. According to an embodiment of the invention, the second process material can include a reducing agent, for example hydrogen (H$_2$) gas, ammonia (NH$_3$), hydrazine (N$_2$H$_4$), dimethyl amine (NH(CH$_3$)$_2$), methyl hydrazine (N$_2$H$_3$CH$_3$), silane (SiH$_4$), or disilane (Si$_2$H$_6$), or a combination of two or more thereof. The second process material may be delivered undiluted to the process chamber or a carrier gas may be used to dilute the second process material. The carrier gas can, for example, include Ar or N$_2$. According to one embodiment of the invention, the second process material may consist of undiluted H$_2$ gas.

In block 306, the plasma excitation heats the reducing agent, thus causing ionization and/or dissociation of the reducing agent in order to form radicals and/or ions that chemically react with the first process material adsorbed on the substrate to facilitate the reduction process and reduce impurities within the deposited film. The reduction reaction completed in block 306 results in a thin layer of a metal carbonitride or metal carbide film 104 being deposited on the patterned structure. The thin layer can have a thickness of about one atomic layer, or less. Once the reduction reaction in block 306 has been carried out and unreacted second process material and reaction byproducts are removed from the process chamber, the exposure steps in blocks 304 and 306 may be repeated a predetermined number of times as shown by process flow 308 to deposit additional layers of the a metal carbonitride or metal carbide film 104 until a desired thickness has been formed. In the exemplary embodiment depicted in FIG. 4, three layers of the metal carbonitride or metal carbide film 104 are formed on the patterned structure.

In block 310, the metal carbonitride or metal carbide film 104 is exposed to Ar gas for a time period 430 and a plasma is generated in the process chamber for a time period 421 during exposure of the Ar gas. As depicted in FIG. 4, the process chamber may be purged by the Ar gas to stabilize the gas flow and process chamber pressure prior to the plasma generation. The time period 430 can, for example, be between 1 sec and 100 sec long, and can be 70 sec long. The time period 421 can, for example, be between 1 sec and 100 sec long, and can be 60 sec long. The process chamber pressure can, for example, be between 0.05 Torr and 5 Torr, and can be 0.5 Torr. A gas flow rate of the Ar gas can, for example, be between 10 sccm and about 5000 sccm, and can be 1000 sccm. It is contemplated that the exposure to plasma-excited Ar removes surface species such as carbon (C), nitrogen (N), oxygen (O), or water (H$_2$O) from the metal carbonitride or metal carbide film 104, generates free (active) metal (Ta or Ti) sites and atomic level roughening, increases density, or increases crystallinity of the metal carbonitride or metal carbide film 104, or a combination thereof. According to one embodiment of the invention, the exposing steps in blocks 304, 306, and 310 can be performed within the same process chamber, but this is not required as an exposing step in block 310 may be performed in a different process chamber than the exposing steps in blocks 304 and 306, for example in a process chamber configured for plasma treating of substrates.

When the exposure to plasma excited Ar in block 310 is complete, the exposure steps in blocks 304, 306, and 310 may be repeated a predetermined number of times as shown by process flow 312 to deposit additional layers of the metal carbonitride or metal carbide film 104. In the exemplary embodiment depicted in FIG. 4, the process flow 312 is not performed. According to one embodiment, a plasma power between 100 Watts (W) and 2000 W, for example 500W, may be utilized in blocks 306, 310, and 314.

According to another embodiment of the invention, a plasma may be generated in the process chamber during exposure of the first process material to the patterned structure.

In block 314, the metal carbonitride or metal carbide film 104 is exposed to a nitrogen-containing gas for a time period 440 and a plasma is generated in the process chamber for a time period 422 to form an oxidation-resistant diffusion barrier 106. As depicted in FIG. 3, the process chamber may be purged by the nitrogen-containing gas to remove reaction byproducts from the process chamber and to stabilize the gas flow and process chamber pressure prior to the plasma generation. The time period 440 can, for example, be between 1 sec and 100 sec long, and can be 70 sec long. The time period 422 can, for example, be between 1 sec and 100 sec long, and can be 60 sec long. The process chamber pressure can, for example, be between 0.05 Torr and 5 Torr, and can be 1 Torr. The nitrogen-containing gas can include N$_2$, NH$_3$, NH(CH$_3$)$_2$, N$_2$H$_4$, or N$_2$H$_3$CH$_3$, or a combination of two or more thereof. In addition, the nitrogen-containing gas can contain H$_2$. In one example, the nitrogen-containing gas may contain N$_2$ and H$_2$. Exemplary N$_2$ and H$_2$ gas flow rates are between 10 sccm and about 5000 sccm. In one example, the $N_2$ gas flow rate can be 500 sccm and the $H_2$ gas flow rate can be 2000 sccm.

According to another embodiment of the invention, when the exposure to plasma-excited nitrogen-containing gas in block 314 is complete, the exposure steps in blocks 304, 306, 310 and 314 may be repeated a predetermined number of times as shown by process flow 316 to form additional layers of the oxidation-resistant diffusion barrier 106. This allows for increased control over the nitrogen-content and depth profile of nitrogen in the oxidation-resistant diffusion barrier 106.

Figure 5:
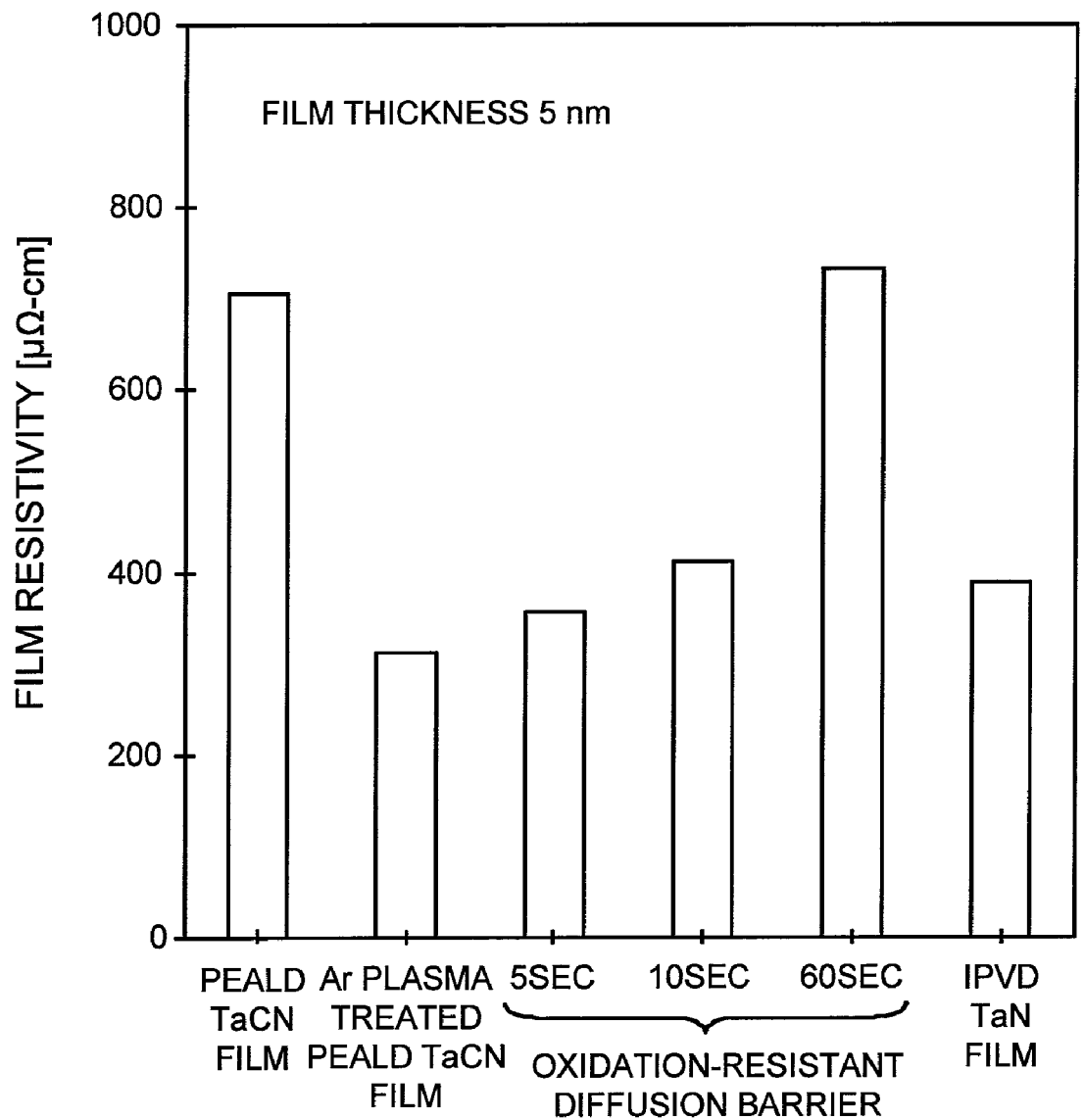
FIG. 5 shows film resistivity for different Ta-containing films and film post-deposition treatments according to embodiments of the invention.

FIG. 5 shows film resistivity for different Ta-containing films and film post-deposition treatments according to embodiments of the invention. A PEALD TaCN film was deposited by sequentially performing the steps in blocks 304 and 306 in FIG. 3 a total of 100 times, but without performing the steps in blocks 310 and 314. In block 304, a 1 sec exposure of a first process material contained 50 sccm of Ar carrier gas bubbled through a TAIMATA precursor and 50 sccm of Ar dilution gas. In block 306, a 10 sec exposure of a second process material consisted of 2000 sccm of undiluted $H_2$ gas and 500 W of plasma power at a frequency of 13.56 MHz applied to a substrate holder supporting the substrate in the process chamber. Furthermore, the undiluted $H_2$ gas was flowed for an additional 1 sec prior to generating the plasma in the process chamber. An Ar plasma treated PEALD TaCN film was deposited in a similar way as the PEALD TaCN barrier, but the process was interrupted 5 times to perform the step in block 310. In other words, the steps in blocks 304 and 306 were sequentially performed 20 times before performing the step in block 310. This sequence was repeated 5 times, and the step in block 314 was not performed. An oxidation-resistant diffusion barrier was deposited by exposing Ar plasma treated PEALD TaCN films to a $N_2+H_2$ plasma in block 314. Three different plasma exposure times were used: 5 sec, 10 sec, and 60 sec. Film resistivity of an ionized physical vapor deposition (IPVD) TaN film is shown for comparison. FIG. 5 shows that the Ar plasma treated PEALD TaCN film had lower film resistivity than the PEALD TaCN and IPVD TaN films. Furthermore, film resistivity increased by increasing exposures times to the $N_2+H_2$ plasma in block 314.

Figure 6:
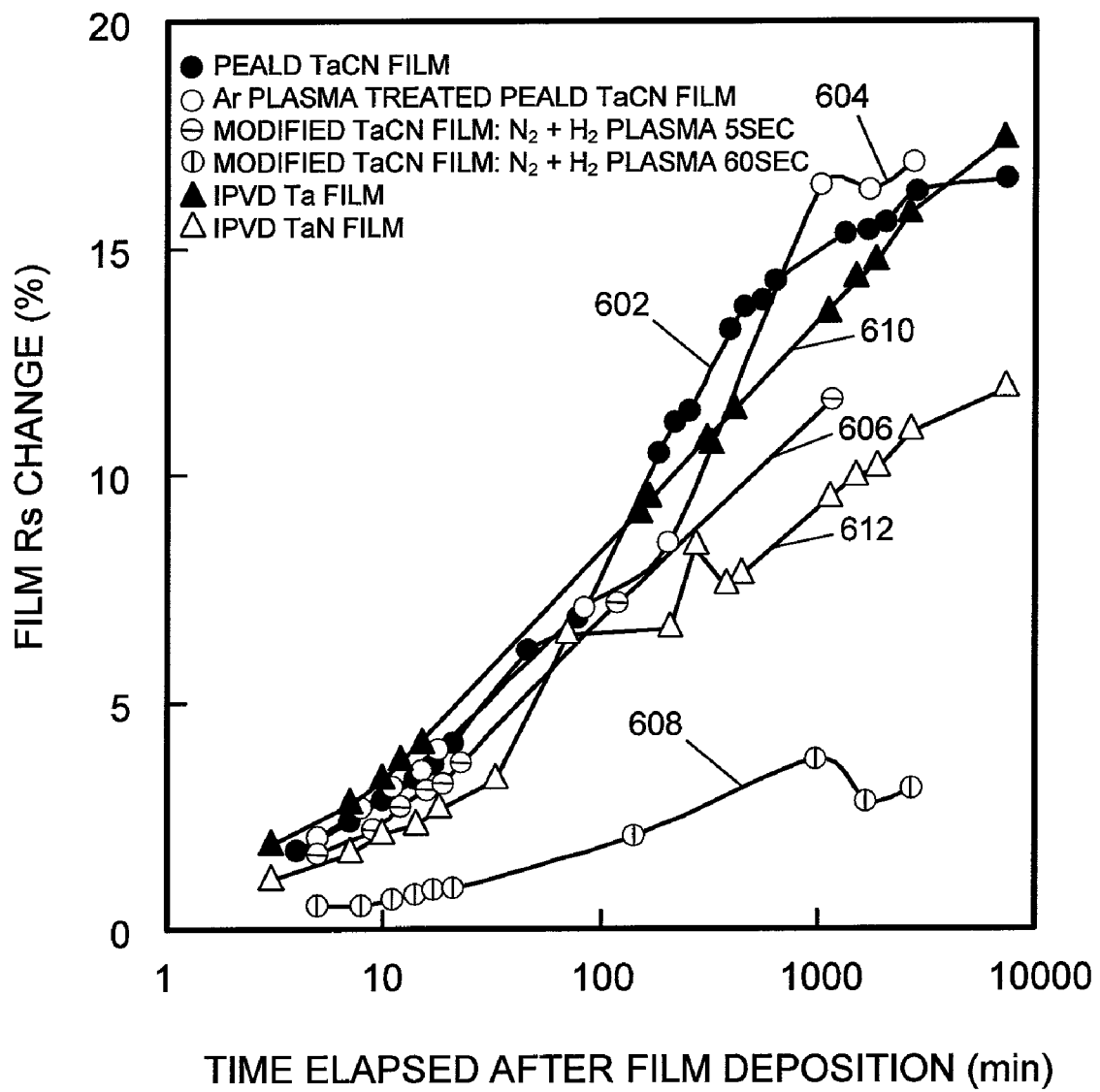
FIG. 6 shows film resistivity changes as a function of elapsed time after film deposition.

FIG. 6 shows film resistivity changes as a function of elapsed time after film deposition. The films were exposed to air at room temperature during the time elapsed in order to evaluate resistance to oxidation by an oxidizing environment prior to or during deposition of a Ru film on the films. As seen in FIG. 6, the film resistivity increased with increased time elapsed after deposition due to increased oxidation of the films. In FIG. 6, the oxidation-resistant diffusion barriers in traces 606 (5 sec $N_2+H_2$ plasma) and 608 (60 sec $N_2+H_2$ plasma) showed better oxidation resistance than the PEALD TaCN film (trace 602) and the Ar plasma treated PEALD TaCN film (trace 604). Furthermore, the oxidation-resistant diffusion barrier in trace 608 showed better resistance to oxidation than the IPVD TaN film (trace 612) and an IPVD Ta film (trace 610). Comparison of FIGS. 5 and 6 shows that although the oxidation-resistant diffusion barrier has higher film resistivity than the PEALD TaCN film and, in particular, higher film resistivity than the Ar plasma treated PEALD TaCN film, the oxidation-resistant diffusion barrier has much better resistance to oxidation than the PEALD TaCN film and the Ar plasma treated PEALD TaCN film. Thus, embodiments of the invention provide an oxidation-resistant diffusion barrier with excellent resistance to oxidation and therefore low levels of oxygen contaminants, good adhesion to other materials in the semiconductor device, and low contact resistivity at the bottom of micro-features.

Figure 7:
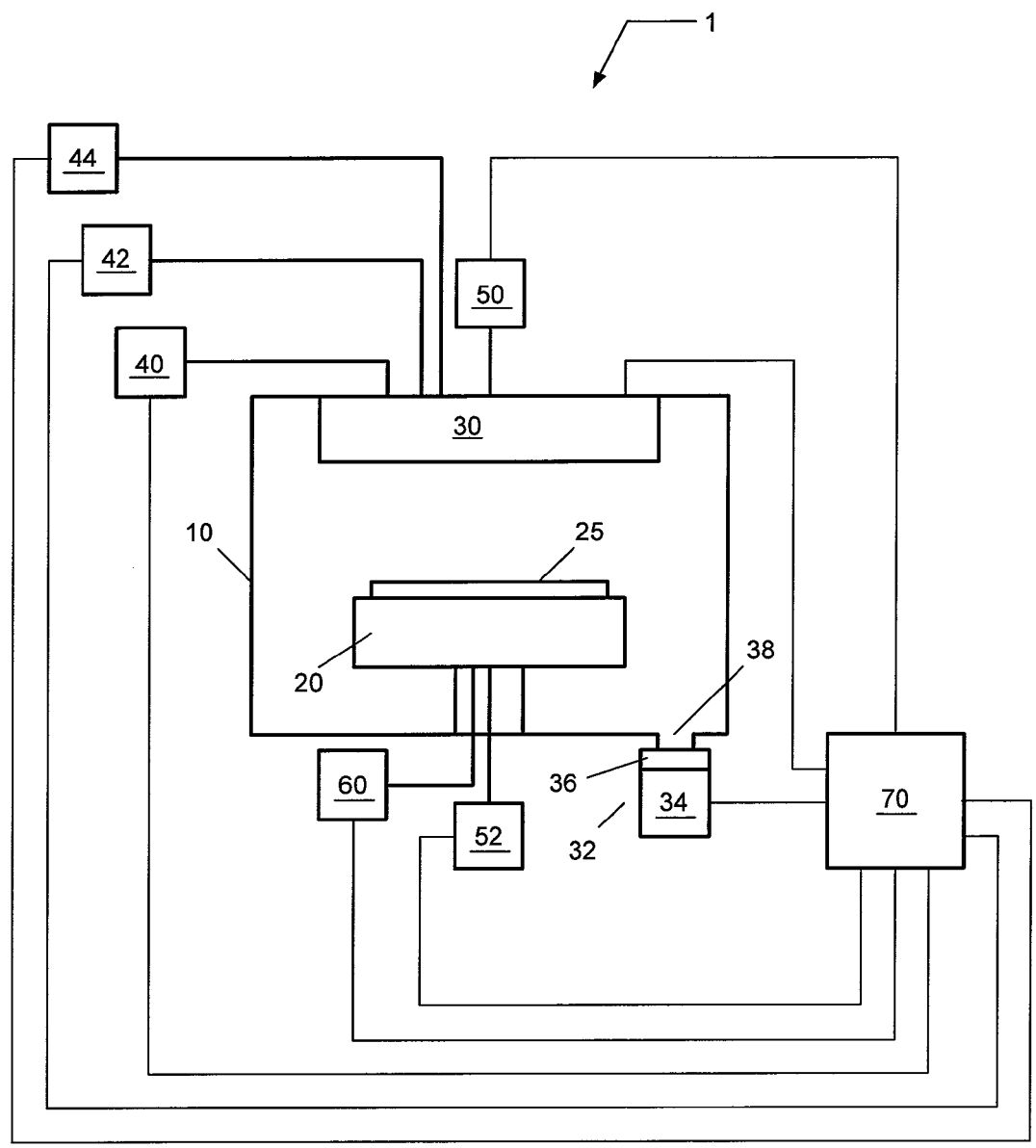
FIG. 7 depicts a schematic view of a processing system in accordance with an embodiment of the invention.

FIG. 7 depicts a schematic view of a processing system in accordance with an embodiment of the invention. As those skilled in the art will readily recognize, the processing system 1 can be utilized to perform various deposition processes, including CVD, pulsed CVD, PECVD, ALD, or PEALD. A PEALD process is described below for depositing a metal carbonitride or metal carbide film on a patterned structure. According to one embodiment, the processing system 1 may also be used to treat the metal carbonitride or metal carbide film with an Ar plasma, and to form an oxidation-resistant diffusion barrier by incorporating nitrogen into the Ar plasma treated metal carbonitride or metal carbide film. The processing system 1 includes a process chamber 10 having a substrate holder 20 configured to support a substrate 25 containing the patterned structure upon which the metal carbonitride or metal carbide film is to be formed. The process chamber 10 further contains an upper assembly 30 coupled to a first process material supply system 40, a second process material supply system 42, and a purge gas supply system 44. Additionally, the processing system 1 includes a first power source 50 coupled to the process chamber 10 and configured to generate plasma in the process chamber 10, and a substrate temperature control system 60 coupled to substrate holder 20 and configured to elevate and control the temperature of substrate 25.

In FIG. 7, singular processing elements (10, 20, 30, 40, 42, 44, 50, and 60) are shown, but this is not required for the invention. The processing system 1 can include any number of processing elements having any number of controllers associated with them in addition to independent processing elements.

Still referring to FIG. 7, the processing system 1 may be configured to process 200 mm substrates, 300 mm substrates, or larger-sized substrates. In fact, it is contemplated that the deposition system may be configured to process substrates, wafers, or flat panel displays regardless of their size, as would be appreciated by those skilled in the art. Therefore, while aspects of the invention will be described in connection with the processing of a semiconductor substrate, the invention is not limited solely thereto.

The first process material supply system 40 and the second process material supply system 42 are configured to alternately introduce a first process material and a second process material to the process chamber 10. The alternation of the introduction of the first material and the introduction of the second material can be cyclical, or it may be acyclical with variable time periods between introduction of the first and second materials. The first process material can contain a Ta- or Ti-containing precursor. For instance, the Ta- or Ti-containing precursor can originate as a solid phase, a liquid phase, or a gaseous phase, and it may be delivered to process chamber 10 in a gaseous phase with or without the use of a carrier gas. The second process material can, for example, comprise a reducing agent. For instance, the reducing agent can originate as a solid phase, a liquid phase, or a gaseous phase, and it may be delivered to process chamber 10 in a gaseous phase with or without the use of a carrier gas.

Additionally, the purge gas supply system 44 can be configured to introduce a purge gas to process chamber 10. For example, the introduction of purge gas may occur between introduction of the first process material and the second process material to process chamber 10, or following the introduction of the second process material to process chamber 10, respectively. The purge gas can comprise an inert gas, such as a noble gas (i.e., helium, neon, argon, xenon, krypton), $N_2$, or $H_2$.

Referring still to FIG. 7, the processing system 1 includes a plasma generation system configured to generate a plasma during at least a portion of the alternating introduction of the first process material and the second process material to process chamber 10. The plasma generation system can include the first power source 50 coupled to the process chamber 10, and configured to couple power to gases in the process chamber 10. The first power source 50 may be a variable power source and may include a radio frequency (RF) generator and an impedance match network, and may further include an electrode through which RF power is coupled to the plasma in process chamber 10. The electrode can be formed in the upper assembly 30, and it can be configured to oppose the substrate holder 20. The impedance match network can be configured to optimize the transfer of RF power from the RF generator to the plasma by matching the output impedance of the match network with the input impedance of the process chamber, including the electrode, and plasma. For instance, the impedance match network serves to improve the transfer of RF power to plasma in the process chamber 10 by reducing the reflected power. Match network topologies (e.g. L-type, π-type, T-type, etc.) and automatic control methods are well known to those skilled in the art.

Alternatively, the first power source 50 may include a RF generator and an impedance match network, and may further include an antenna, such as an inductive coil, through which RF power is coupled to plasma in process chamber 10. The antenna can, for example, include a helical or solenoidal coil, such as in an inductively coupled plasma source or helicon source, or it can, for example, include a flat coil as in a transformer coupled plasma source.

Alternatively, the first power source 50 may include a microwave frequency generator, and may further include a microwave antenna and microwave window through which microwave power is coupled to plasma in process chamber 10. The coupling of microwave power can be accomplished using electron cyclotron resonance (ECR) technology, or it may be employed using surface wave plasma technology, such as a slotted plane antenna (SPA), as described in U.S. Pat. No. 5,024,716, entitled "PLASMA PROCESSING APPARATUS FOR ETCHING, ASHING, AND FILM FORMATION," the contents of which are herein incorporated by reference in its entirety.

According to one embodiment of the invention, the processing system 1 includes a substrate bias generation system configured to generate or assist in generating a plasma (through substrate holder biasing) during at least a portion of the alternating introduction of the first process material and the second process material to process chamber 10. The substrate bias system can include a substrate power source 52 coupled to the process chamber 10, and configured to couple power to substrate 25. The substrate power source 52 may include a RF generator and an impedance match network, and may further include an electrode through which RF power is coupled to substrate 25. The electrode can be formed in substrate holder 20.

For instance, substrate holder 20 can be electrically biased at a RF voltage via the transmission of RF power from a RF generator (not shown) through an impedance match network (not shown) to substrate holder 20. A typical frequency for the RF bias can range from about 0.1 MHz to about 100 MHz, and can be 13.56 MHz. RF bias systems for plasma processing are well known to those skilled in the art. Alternatively, RF power is applied to the substrate holder electrode at multiple frequencies. In one example, the substrate power source 52 may generate a plasma through biasing of the substrate holder 20 while the upper assembly 30 is grounded.

Although the plasma generation system and the substrate bias system are illustrated in FIG. 7 as separate entities, they may indeed comprise one or more power sources coupled to substrate holder 20.

Still referring to FIG. 7, processing system 1 includes substrate temperature control system 60 coupled to the substrate holder 20 and configured to elevate and control the temperature of substrate 25. Substrate temperature control system 60 comprises temperature control elements, such as a cooling system including a re-circulating coolant flow that receives heat from substrate holder 20 and transfers heat to a heat exchanger system (not shown), or when heating; transfers heat from the heat exchanger system. Additionally, the temperature control elements can include heating/cooling elements, such as resistive heating elements, or thermoelectric heaters/coolers, which can be included in the substrate holder 20, as well as the chamber wall of the process chamber 10 and any other component within the processing system 1.

In order to improve the thermal transfer between substrate 25 and substrate holder 20, substrate holder 20 can include a mechanical clamping system, or an electrical clamping system, such as an electrostatic clamping system, to affix substrate 25 to an upper surface of substrate holder 20. Furthermore, substrate holder 20 can further include a substrate backside gas delivery system configured to introduce gas to the back-side of substrate 25 in order to improve the gas-gap thermal conductance between substrate 25 and substrate holder 20. Such a system can be utilized when temperature control of the substrate is required at elevated or reduced temperatures. For example, the substrate backside gas system can comprise a two-zone gas distribution system, wherein the helium gas gap pressure can be independently varied between the center and the edge of substrate 25.

Furthermore, the process chamber 10 is further coupled to a pressure control system 32, including a vacuum pumping system 34 and a valve 36, through a duct 38, wherein the pressure control system 32 is configured to controllably evacuate the process chamber 10 to a pressure suitable for forming the thin film on substrate 25, and suitable for use of the first and second process materials. The vacuum pumping system 34 can include a turbo-molecular vacuum pump (TMP) or a cryogenic pump capable of a pumping speed up to about 5000 liters per second (and greater) and valve 36 can include a gate valve for throttling the chamber pressure. In conventional plasma processing devices utilized for dry plasma etching, a 300 to 5000 liter per second TMP is generally employed. Moreover, a device for monitoring chamber pressure (not shown) can be coupled to the process chamber 10. The pressure measuring device can, for example, be a capacitance manometer.

The processing system 1 includes a controller 70 than can be used to configure any number of processing elements of the processing system 1, and the controller 70 can collect, provide, process, store, and display data from processing elements. The controller 70 can comprise a number of applications for controlling one or more of the processing elements. For example, controller 70 can include a graphic user interface (GUI) component (not shown) that can provide easy to use interfaces that enable a user to monitor and/or control one or more processing elements. Alternatively, or in addition, controller 70 can be coupled to one or more additional controllers/computers (not shown), and controller 70 can obtain setup and/or configuration information from an additional controller/computer.

The controller 70 can comprise a microprocessor, memory, and a digital I/O port capable of generating control voltages sufficient to communicate and activate inputs of the processing elements of the processing system 1 as well as monitor outputs from the processing system 1. For example, a program stored in the memory may be utilized to activate the inputs to the aforementioned components of the processing system 1 according to a process recipe in order to perform an etching process, or a deposition process.

The controller 70 may be implemented as a general purpose computer system that performs a portion or all of the microprocessor based processing steps of embodiments of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 70 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 70, for driving a device or devices for implementing embodiments the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing embodiments of the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 70 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 70.

The controller 70 may be locally located relative to the processing system 1, or it may be remotely located relative to the processing system 1. For example, the controller 70 may exchange data with the processing system 1 using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer). Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the processing system 1 via a wireless connection.

A plurality of embodiments for formation of a semiconductor contact structure is disclosed in various embodiments. The structure includes a micro-feature containing bulk Cu metal, a Ru film, and an oxidation-resistant diffusion barrier. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a first layer "on" a second layer is directly on and in immediate contact with the second layer unless such is specifically stated; there may be a third layer or other structure between the first layer and the second layer on the first layer.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method for forming a semiconductor contact structure, the method comprising:
   providing a patterned structure in a process chamber, the patterned structure containing a micro-feature formed in a dielectric material and a contact layer at the bottom of the micro-feature;
   depositing a metal carbonitride or metal carbide film on the patterned structure, including in the micro-feature and on the contact layer, wherein the depositing a metal carbonitride or metal carbide film comprises:
   (a) exposing the patterned structure to a first process material comprising a Ta-containing precursor or a Ti-containing precursor;
   (b) exposing the patterned structure to a second process material comprising a plasma-excited reducing agent;
   (c) repeating steps (a) and (b) a predetermined number of times;
   (d) after step (c) exposing the patterned structure to plasma-excited Ar; and
   (e) repeating steps (c) and (d) until the metal carbonitride or metal carbide film has a desired thickness;

forming an oxidation-resistant diffusion barrier by increasing the nitrogen-content of the deposited metal carbonitride or metal carbide film;

depositing a Ru film on the oxidation-resistant diffusion barrier; and forming bulk Cu metal in the micro-feature, wherein the Ru film and the oxidation-resistant diffusion barrier surround the bulk Cu metal in the micro-feature.

2. The method of claim 1, wherein the metal carbonitride film comprises TaCN or TiCN and the metal carbide film comprises TaC or TiC.

3. The method of claim 1, wherein the Ru film is deposited in the presence of an oxygen-containing process gas.

4. The method of claim 1, wherein the Ru film is deposited by thermal decomposition of $Ru_3(CO)_{12}$ in the presence of a CO carrier gas.

5. The method of claim 1, wherein the contact layer comprises a silicide contact layer containing $CoSi_2$, PtSi, $Pd_2Si$, $TiSi_2$, $WSi_2$, $NiSi_2$, or $TaSi_2$, or a combination of two or more thereof.

6. The method of claim 1, wherein the metal carbonitride film comprises a TaCN film and the first process material comprises $Ta(NMe_2)_3(NCMe_2Et)$ (TAIMATA), $Ta(NEt_2)_5$ (PDEAT), $Ta(NMe_2)_5$ (PDMAT), $Ta(NEtMe)_5$ (PEMAT), $(tBuN)Ta(NMe_2)_3$ (TBTDMT), $(tBuN)Ta(NEt_2)_3$ (TBTDET), $(tBuN)Ta(NEtMe)_3$ (TBTEMT), or $(iPrN)Ta(NEt_2)_3$ (IPTDET).

7. The method of claim 1, wherein the metal carbide film comprises a TaC film and the first process material comprises $Ta(\eta^5-C_5H_5)_2H_3$, $Ta(CH_2)(CH_3)(\eta^5-C_5H_5)_2$, $Ta(\eta^3-C_3H_5)(\eta^5-C_5H_5)_2$, $Ta(CH_3)_3(\eta^5-C_5H_5)_2$, $Ta(CH_3)_4(\eta^5-C_5(CH_3)_5)$, or $Ta(\eta^5-C_5(CH_3)_5)_2H_3$.

8. The method of claim 1, wherein the metal carbonitride film comprises a TiCN film and the first process material comprises $Ti(NEt_2)_4$ (TDEAT), $Ti(NMeEt)_4$ (TEMAT), or $Ti(NMe_2)_4$ (TDMAT).

9. The method of claim 1, wherein the metal carbide film comprises TiC and the first process material comprises $Ti(COCH_3)(\eta^5-C_5H_5)_2Cl$, $Ti(\eta^5-C_5H_5)Cl_2$, $Ti(\eta^5-C_5H_5)Cl_3$, $Ti(\eta^5-C_5H_5)_2Cl_2$, $Ti(\eta^5-C_5(CH_3)_5)Cl_3$, $Ti(CH_3)(\eta^5-C_5H_5)_2Cl$, $Ti(\eta^5-C_9H_7)_2Cl_2$, $Ti((\eta^5-C_5(CH_3)_5)_2Cl$, $Ti((\eta^5-C_5(CH_3)_5)_2Cl_2$, $Ti(\eta^5-C_5H_5)_2(\mu-Cl)_2$, $Ti(\eta^5-C_5H_5)_2(CO)_2$, $Ti(CH_3)_3(\eta^5-C_5H_5)$, $Ti(CH_3)_2(\eta^5-C_5H_5)_2$, $Ti(CH_3)_4$, $Ti(\eta^5-C_5H_5)(\eta^7-C_7H_7)$, $Ti(\eta^5-C_5H_5)(\eta^8-C_8H_8)$, $Ti(C_5H_5)_2(\eta^5-C_5H_5)_2$, $Ti((C_5H_5)_2(\eta-H)_2$, $Ti(\eta^5-C_5(CH_3)_5)_2$, $Ti(\eta^5-C_5(CH_3)_5)_2(H)_2$, or $Ti(CH_3)_2(\eta^5-C_5(CH_3)_5)_2$.

10. The method of claim 1, wherein the second process material comprises $H_2$, $NH_3$, $N_2H_4$, $NH(CH_3)_2$, $N_2H_3CH_3$, $SiH_4$, or $Si_2H_6$, or a combination of two or more thereof.

11. The method of claim 1, wherein the patterned structure comprises a first micro-feature containing a first contact layer in electrical contact with a gate electrode and a second micro-feature containing a second contact layer in electrical contact with a doped substrate region.

12. The method of claim 1, wherein the forming an oxidation-resistant diffusion barrier comprises exposing the metal carbonitride or metal carbide film to a plasma-excited nitrogen-containing gas.

13. The method of claim 12, wherein the nitrogen-containing gas comprises $N_2$, $NH_3$, $NH(CH_3)_2$, $N_2H_4$, or $N_2H_3CH_3$.

14. A method for forming a semiconductor contact structure, the method comprising:

providing a patterned structure in a process chamber, the patterned structure containing a plurality of micro-features formed in a dielectric material and a silicide contact layer at the bottom of each micro-feature;

depositing a TaCN film on the patterned structure, including in the plurality of micro-features and on the silicide contact layer at the bottom of each micro-feature, wherein the depositing a TaCN film comprises:

(a) exposing the patterned structure to a first process material comprising a Ta-containing precursor;

(b) exposing the patterned structure to a second process material comprising plasma-excited $H_2$;

(c) repeating steps (a) and (b) a predetermined number of times;

(d) after step (c) exposing the substrate to plasma-excited Argon; and (e) repeating steps (c) and (d) until the TaCN film has a desired thickness;

forming an oxidation-resistant diffusion barrier by exposing the TaCN film to a plasma-excited nitrogen-containing gas comprising $N_2$, $NH_3$, $NH(CH_3)_2$, $N_2H_4$, or $N_2H_3CH_3$;

depositing a Ru film on the oxidation-resistant diffusion barrier by thermal decomposition of $Ru_3(CO)_{12}$ in the presence of a CO carrier gas; and forming bulk Cu metal in the micro-feature, wherein the Ru film and the oxidation-resistant diffusion barrier surround the bulk Cu metal in the micro-feature.

15. The method of claim 14, wherein the first process material comprises $Ta(NMe_2)_3(NCMe_2Et)$ (TAIMATA), $Ta(NEt_2)_5$ (PDEAT), $Ta(NMe_2)_5$ (PDMAT), $Ta(NEtMe)_5$ (PEMAT), $(tBuN)Ta(NMe_2)_3$ (TBTDMT), $(tBuN)Ta(NEt_2)_3$ (TBTDET), $(tBuN)Ta(NEtMe)_3$ (TBTEMI), or $(iPrN)Ta(NEt_2)_3$ (IPTDET).

16. A method for forming a semiconductor contact structure, the method comprising:

providing a patterned structure in a process chamber, the patterned structure containing a micro-feature formed in a dielectric material and a contact layer at the bottom of the micro-feature;

depositing a TaC or TiC film on the patterned structure, including in the micro-feature and on the contact layer;

forming an oxidation-resistant diffusion barrier by increasing the nitrogen-content of the deposited TaC or TiC film, wherein the forming an oxidation-resistant diffusion barrier comprises exposing the TaC or TiC film to a plasma-excited nitrogen-containing gas containing $N_2$, $NH_3$, $NH(CH_3)_2$, $N_2H_4$, or $N_2H_3CH_3$;

depositing a Ru film on the oxidation-resistant diffusion barrier; and forming bulk Cu metal in the micro-feature, wherein the Ru film and the oxidation-resistant diffusion barrier surround the bulk Cu metal in the micro-feature.

17. The method of claim 16, wherein the Ru film is deposited by thermal decomposition of $Ru_3(CO)_{12}$ in the presence of a CO carrier gas.

18. The method of claim 16, wherein the patterned structure comprises a first micro-feature containing a first contact layer in electrical contact with a gate electrode and a second micro-feature containing a second contact layer in electrical contact with a doped substrate region.

* * * * *